United States Patent [19]
Koh et al.

[11] Patent Number: 5,345,423
[45] Date of Patent: Sep. 6, 1994

[54] PARALLEL TEST CIRCUIT OF A SEMICONDUCTOR MEMORY DEVICE

[75] Inventors: Hwa-Soo Koh; Seung-Han Ahn; Ho-Ki Kim, all Seoul, Rep. of Korea

[73] Assignee: Hyundai Electronics Industries Co., Ltd., Kyoungki-Do, Rep. of Korea

[21] Appl. No.: 20,363

[22] Filed: Feb. 22, 1993

[30] Foreign Application Priority Data

Feb. 21, 1992 [KR] Rep. of Korea ............... 92-2646

[51] Int. Cl.$^5$ ............................................ G11C 13/00
[52] U.S. Cl. ........................... 365/201; 365/203; 365/206
[58] Field of Search ............. 365/201, 203, 189.05, 365/189.08, 230.08, 206; 371/21.1, 21.3

[56] References Cited

U.S. PATENT DOCUMENTS 5,25,854  10/1993  Lien ........................ 365/201

*Primary Examiner*—Terrell W. Fears
*Attorney, Agent, or Firm*—Ladas & Parry

[57] ABSTRACT

A parallel test circuit that can perform the parallel test and data reading of the memory device at the same time. By using it, one can shorten the test time. The parallel test circuit of the present invention has several MOS transistors N1 to NK where several data Data1 to DataK selected from the memory cell are input into each gate and their drains are commonly connected to an input/output line. Also, it has several MOS transistors n1 to nk where $\overline{\text{Data1}}$ to $\overline{\text{DataK}}$ which are complementary data of said Data1 to DataK are input into each gate and their drains are commonly connected to another input/output line. Finally, it has load transistors P1 and P2 used to pre-charge said input/output lines. During the normal reading operation, it switches on data line pairs that have been selected, and then reads their data. During the parallel test, it evaluates whether the data is erroneous according to the output voltage level of the input/output lines by inputting all the data at the same time. Since it can test all the data at the same time, the test time can be shortened. Also, unlike the conventional logic circuit, its circuit is less complicated.

4 Claims, 3 Drawing Sheets

5,345,423

PARALLEL TEST CIRCUIT OF A SEMICONDUCTOR MEMORY DEVICE

BACKGROUND OF THE INVENTION

This invention relates to an improved parallel test circuit used to shorten the test time of a semiconductor memory device, and more particularly to a parallel test circuit that can perform the parallel test and data reading at the same time. By using the test circuit of the present invention whose circuit is less complicated than the conventional one, the test time is shortened and the test accuracy improved.

Generally, as the integration of the memory device increases to 4 Mega bit, 16 Mega bit, and 64 Mega bit, and so forth, the test time for the memory device also increases. Accordingly, a parallel test method that tests several bits simultaneously in order to shorten the test time is used. A parallel test is performed by storing "1" (high) or "0" (low) at the same time onto the several cells that have been selected to test and then by reading them at the same time to see whether the same data as stored are read out. For example, if all the data are found to be "1"s when reading the cells after storing "1"s onto all the cells that had been selected, the test is evaluated as "pass". If any of the data are read as "0"s, the test is evaluated as "fail".

Up to now, a logic circuit has been used when carrying out a test on the memory device described above. For example, a 16 bit parallel test circuit illustrated in FIG. 1 has been used when testing 16 Mega DRAM. In the conventional parallel test circuit illustrated in FIG. 1, 16 data D1 through D16, each of which is 1 bit data, are divided into four groups of input IN1 to IN4 with each group having 4 data, and then are input into the logic circuit for testing. Then first, four data of each group of input IN1 through IN4 are compared with each other to see whether they are the same, and then they are output as final outputs after comparing their outputs again. However, as described previously, the disadvantages of the conventional method are that it takes too long to compare the data under all given conditions and that many transistors must be used in order to carry out the test successfully. Also, an accurate error check is impossible since the data of input IN1 and data of input IN2 are not compared with each other even though the data D1, D2, D3, and D4 are compared through input IN1 and the data D5, D6, D7, and D8 are compared through input IN2.

SUMMARY OF THE INVENTION

Accordingly, it is an objective of this invention to provide a parallel test circuit that can carry out a parallel test and normal data reading at the same time.

Another objective of this invention is to provide a parallel test circuit, in which the complexity, time delay, and test accuracy of the conventional parallel test circuit are improved.

In order to achieve these objectives, the parallel test circuit of the present invention comprises the following: data lines into which a predetermined number of data selected to test from the memory cells are input; other data lines into which complementary data of said predetermined number of selected data are input; MOS transistors with each MOS transistor having a gate into which one of said predetermined number of selected data is input after passing through the one of corresponding data lines and with each MOS having a drain which is connected to an input/output line; other MOS transistors with each MOS transistor having a gate into which one of said complementary data of said predetermined number of the selected data is input after passing through the one of the corresponding other data lines and with each MOS having a drain which is connected to another input/output line; two load transistors for pre-charging each of the above two input/output lines; a sense amplifier for sensing and amplifying the voltage level difference between the two input/output lines to generate the normal reading output signals; two other sense amplifiers for sensing and amplifying the voltage level difference between each voltage of the two input/output lines and the reference voltage; and a logic gate for generating the final test output signals by comparing output signals of said two other sense amplifiers used to sense the voltage level difference between the reference voltage and the voltage of the input/output lines.

The novel features which are believed to be characteristic of the invention, together with further objects and advantages will be better understood from the following description when considered in connection with the accompanying drawings. It is to be expressly understood, however, that each of the drawings are given for the purpose of illustration and description only and are not intended as a definition of the limits of the present invention.

DESCRIPTION OF THE PREFERRED EMBODIMENT

Figure 1:
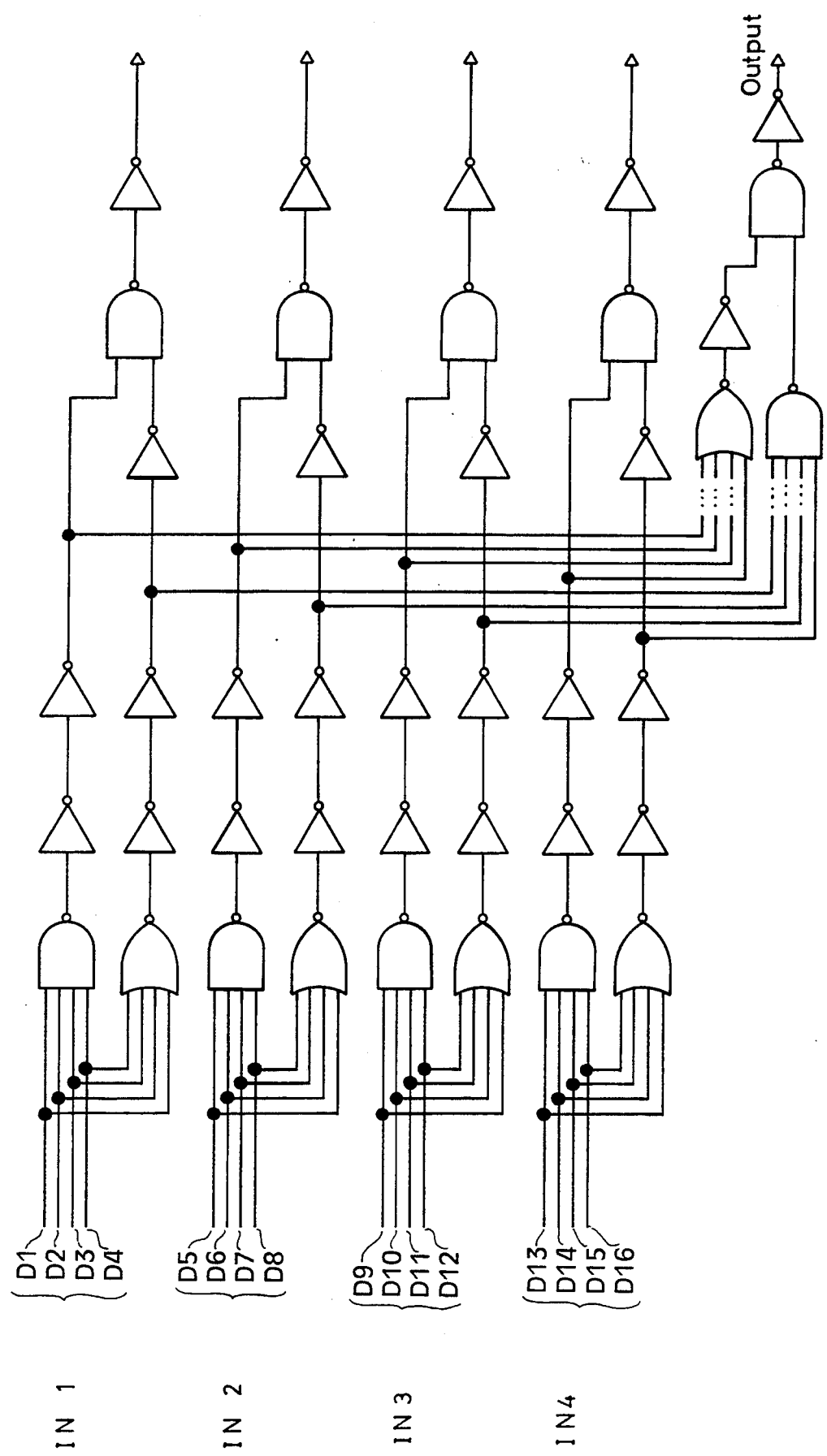
FIG. 1 shows a conventional parallel test circuit with a logic circuit.
Figure 2:
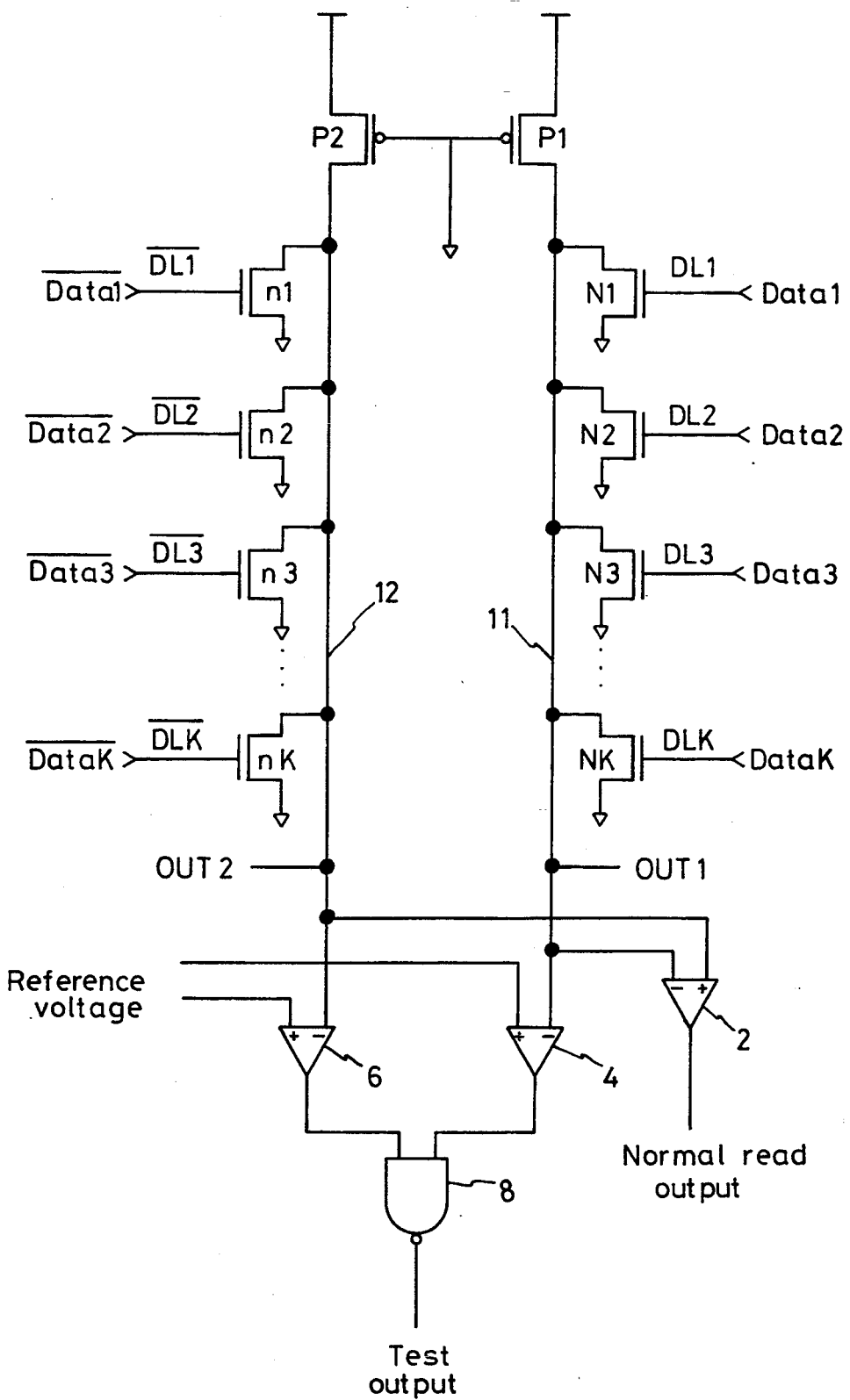
FIG. 2 shows a parallel test circuit of the present invention.

FIG. 2 is a diagram illustrating the parallel test circuit of the present invention. As shown in FIG. 2, data Data1 to DataK which are to be used for testing are respectively connected to gates of NMOS transistors N1 to NK after they pass through data lines DL1 to DLK, respectively. The drains of NMOS transistors N1 to NK are connected to input/output line 11 that has been pre-charged by PMOS load transistor P1. Also, data $\overline{Data1}$ to $\overline{DataK}$ which are complementary data of Data1 to DataK are respectively connected to the gates of NMOS transistor n1 to nK after they pass through data line $\overline{DL1}$ to $\overline{DLK}$. The drains of NMOS transistors n1 to nK are connected to another input/output line 12 that has been pre-charged by PMOS load transistor P2.

When the data are being read normally, only the selected data line pairs such as DL1 and $\overline{DL1}$ or DL2 and $\overline{DL2}$, and so forth are switched on and only the selected data are transferred from the cell blocks and then read persuant to normal procedure. However, during the parallel test mode, all the data are input into the circuit at the same time.

Next, the circuit operation during the parallel test is explained. For example, if it is the case that no error is found at all, when logical "1(high)" data are stored in all the cells that have been selected and the data are read for testing, data Data1 to Datak become logical "1(high)" and NMOS transistors N1 to NK are turned on. Accordingly, input/output line 11 that has been pre-charged to "high" state by load transistor P1 is discharged through transistors N1 to NK, and turns into "low" state. On the other hand, since data $\overline{\text{Data1}}$ to $\overline{\text{DataK}}$, which are complementary data of Data1 to DataK, are all in "0 (low)" state, NMOS transistors n1 through nK turn into "off" state and input/output line 12 is maintained in "high" state where it has been pre-charged by load transistor P2 previously.

Accordingly, the "low" signal at the output terminal OUT1 of the input/output line 11 is input into NAND gate 8 as a "high" signal after it passes sense amplifier 4. The "high" signal at the output terminal OUT2 of input/output line 12 is input into NAND gate 8 as "low" signal after it passes sense amplifier 6. Therefore, the evaluation that there is no error is made because the final test output at NAND gate 8 is in "high" state. However, if any error is found in the bits that have been selected, for example, if an error is found in Data1, Data1 turns into "low" state even though Data2 to DataK remain in normal "high" state. Since Data1 is in "low" state, NMOS transistor N1 turns into off state. However, since transistors N2 to NK turn into on state, previously precharged potential by load transistor P1 is discharged through the transistors N2 to NK, and output terminal OUT1 of the input/output line 11 changes to "low" state.

On the other hand, since $\overline{\text{Data1}}$ which is a complementary data of Data1 is in "high" state, NMOS transistor n1 turns into "on" state (transistor n2 to nK are in "off" state). As a result, output terminal OUT2 of the input/output line 12 changes into "low" state, since transistor n1 is turned on and the precharged potential by load transistor P2 is discharged through transistor n1. Accordingly, existence of errors can be verified by noting that the final test output is in "low" state, since "high" signals of sense amplifiers 4 and 6 enter NAND gate 8.

So far, the operation of the parallel test circuit of the present invention has been explained by classifying the output signals of input/output lines 11, 12 simply into "low" and "high" signals. In the coming section, a more detailed study on the voltage level of the parallel test circuit shall be made.

For the sake of convenience, the reading and testing of four data pairs (Data1, $\overline{\text{Data1}}$), (Data2, $\overline{\text{Data2}}$), (Data3, $\overline{\text{Data3}}$), (Data4, $\overline{\text{Data4}}$) shall be explained first. Output terminal OUT1 and OUT2 are pre-charged, for example, to Vcc voltage level (=5 V) by load transistor P1 and P2, respectively, before a normal reading or parallel test is carried out. When the normal reading is being carried out, one among four data pairs is selected. For example, if a data line pair (DL1, $\overline{\text{DL1}}$) is selected so that $\overline{\text{Data 1}}$ is "high" and Data1 is "low" transistor N1 turns on and transistor n1 turns off. At this time, output terminal OUT2 maintains the Vcc voltage level of the pre-charged state since transistor n1 is in "off" state and transistors n2 to n4 are also in "off" state. However the voltage level of output terminal OUT1 goes down because transistor N1 turns on and then potential of output terminal OUT1 is discharged.

Figure 3:
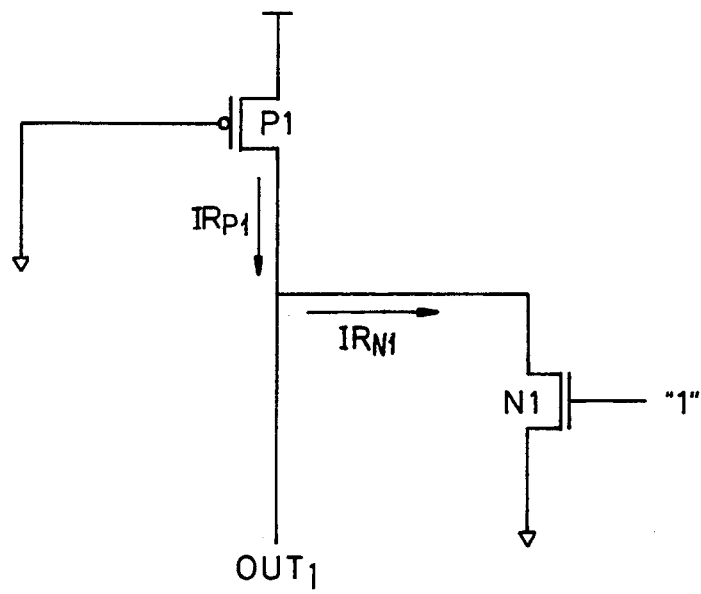
FIG. 3 is a diagram illustrating the charging and discharging relationship of the input/output lines when NMOS transistor N1 of FIG. 2 is being conducted.

In this, the voltage level of output terminal OUT1, as illustrated in FIG. 3, is charged by potential $IR_{P1}$ and discharged by potential $IR_{N1}$. Here, $R_{P1}$ and $R_{N1}$ are internal resistances of transistor P1 and N1, respectively. The voltage level of output terminal OUT1 is determined at a point where $IR_{P1}$ and $IR_{N1}$ are balanced; the voltage level of OUT1 is increased when $IR_{P1}$ decreases and $IR_{N1}$ increases and decreased when the reverse is true. If the voltage level of output terminal OUT1 or OUT2 drops down by 1 V when one transistor is turned on, the voltage of terminal output OUT2 becomes Vcc=5 V and output terminal OUT1 becomes 4 V (5 V−1 V=4 V) during the normal reading operation. Accordingly, amplifier 2 amplifies the voltage difference of 1 V between output terminals OUT1 and OUT2 of two input/output lines 11 and 12, and then finally outputs it. When carrying out a parallel test, four data, i.e., Data1, Data2, Data3, and Data4, are tested at the same time. If no error is found among all four data, transistors n1 to n4 remain in "off" state, and output terminal OUT2 maintains the pre-charged state, i.e., Vcc. However, the voltage level of output terminal OUT1 becomes 1 V (5 V−4 V=1 V), because all transistors N1 to N4 change to "on" state. If one data Data1 out of the four is read to be erroneous, output terminal OUT1 becomes 2 V (5 V−3×1 V=2 V) since transistor N1 turns off and transistors N2, N3, and N4 ruin on and carry out the discharging. Also, the voltage level of output terminal OUT2 becomes 4 V (5 V−1×1 V=4 V) because transistor n1 turns on. If two data are found to be erroneous, the voltage level of output terminal OUT1 becomes 3 V (5 V−2×1 V=3 V) and the voltage level of output terminal OUT2 becomes 3 V (5 V−2×1 V=3 V). As described above during the parallel test mode, the voltage level of input/output lines changes according to the number of erroneous data found.

As described previously, the voltage difference of 1 V found by comparing the voltage levels of output terminals OUT1 and OUT2 is used during the normal reading operation. When carrying out a parallel test, however, the test cannot be performed simply by comparing the voltage difference of output terminals OUT1 and OUT2. Instead, the reference voltage must be compared to the voltage of output terminals OUT1 and OUT2, respectively. If one data is found to be erroneous, the voltage level of OUT2 drops by 1 V to become 4 V; therefore, in order to test accurately, the reference voltage must be set to 4.5 V which is between 5 V (OUT1) and 4 V (OUT2).

In this case, however, the input voltage difference of amplifiers 4 and 6 used for testing becomes 0.5 V which is ½ of the voltage difference (=1 V) obtained during the normal reading. To solve this problem, the size of PMOS transistor of the present invention used for pre-charging is reduced by ½, so that $IR_P$ becomes ½ while $IR_N$ remains unchanged. As a result, the voltage drop increases by two, and thus 0.5 V×2=1 V is secured.

Figure 4:
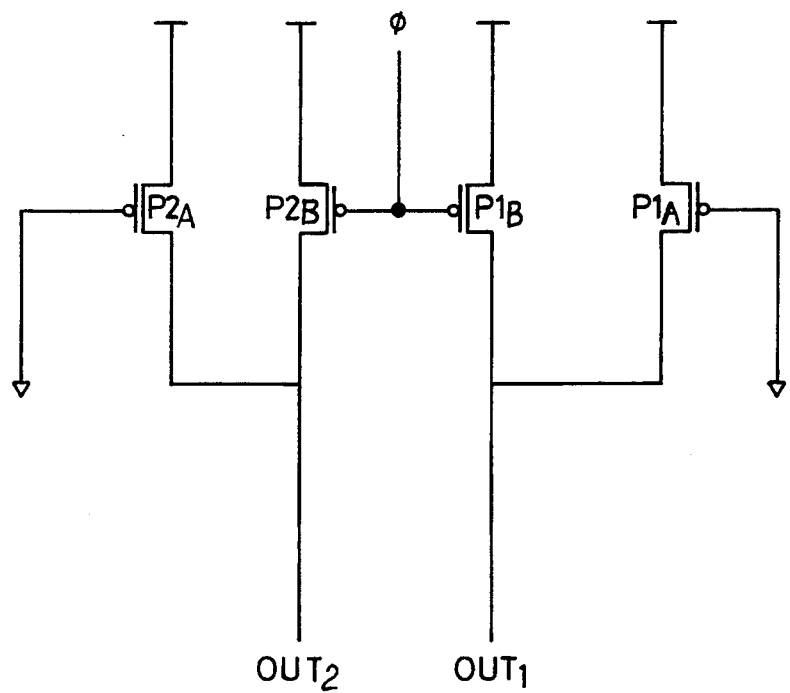
FIG. 4 is a diagram illustrating one example of the present invention formed by dividing the load transistor of FIG. 2 into two.

FIG. 4 is a diagram illustrating an example of the present invention where the load transistor for pre-charging is divided into two. As illustrated in FIG. 4, pre-charge transistors P1 and P2 respectively divided into (P1$_A$, P1$_B$) and (P2$_A$, P2$_B$). Transistors P1$_A$ and P2$_A$ are always maintained in "on" state for pre-charging, and the control signal $\phi$ is fed into transistors P1$_B$ and P2$_B$. When carrying out a normal reading, the input/output lines 11 and 12 are pre-charged by turning on all transistors $P1_A$, $P1_B$, $P2_A$, and $P2_B$ after changing the control signal $\phi$ to "low" state.

On the other hand, transistors $P1_B$ and $P2_B$ are turned off by changing the control signal $\phi$ to "high" state during a parallel test. Then, only transistors $P1_A$ and $P2_A$ are used to reduce the size of transistors for pre-charging in order to secure enough voltage difference as in the case of a normal reading.

In the embodiment of the present invention, load transistors P1 and P2 for pre-charging are illustrated as if they are located on the top part of input/output lines 11 and 12. However, the load transistors can be dispersely placed in several parts of the input/output lines and can be controlled by the control signal. In the case of 64 Mega DRAM, in which the length of the input/output line is about 10 mm and in which 32 cell arrays are connected to the input/output line, if the load transistor is located only in one place, the resistance and capacitance of input/output line becomes so large that it takes too much time for information to reach the output terminal. Therefore, a distribution of the load transistors would be preferable. In order to shorten the RC delay described in the previous section, it is possible to connect the 32 load transistors to 32 cell arrays. Two different methods for doing this are available; one is to arrange two load transistors by dividing each of them into 32 load transistors, so that the size of each load transistor is 1/32 of the original; and the other is to arrange the same sized load transistors to each cell array without reducing the sizes of the load transistors, and then to activate only the load transistors connected to arrays that have been selected using the control signals that select cell arrays.

As described so far, the present invention provides a test circuit that can test all the data simultaneously. Thus, in accordance with the embodiments of the present invention, when carrying out a parallel test of 32 bit or 64 bit on highly integrated memory devices such as 64M DRAM and 256M DRAM, the disadvantages of the conventional test circuit can be improved. In other word, in the conventional logic circuit method where every single data is compared with each other, a circuit configuration becomes too complicated due to the increase in the number of combinations used for each data comparison, and as a result, the test time is increased. However, the parallel test circuit of the present invention can be simplified, and the test time shortened.

It will be obvious to those skilled in the art that many changes may be made to the preferred embodiment. For example, NMOS transistors and PMOS load transistors that have been used in the parallel test circuit of the present invention can be replaced with PMOS transistors and NMOS transistors respectively.

What is claimed is:

1. A parallel test circuit of a memory device comprising:

a plurality of data lines into which a predetermined number of data selected to test from the memory cells are input;

a plurality of other data lines into which complementary data of said predetermined number of selected data are input;

a plurality of MOS transistors, with each MOS transistor having gate into which one of said predetermined number of selected data is input after passing through one of corresponding the data lines and having a drain which is connected to an input/output line;

a plurality of other MOS transistors, with each MOS transistor having a gate into which one of said complementary data of said predetermined number of selected data is input after passing through one of the corresponding other data lines and having a drain which is connected to another input/output line;

two load transistors for pre-charging each of the above two input/output lines;

a sense amplifier for sensing and amplifying the voltage level difference between said two input/output lines to generate the normal reading output signals;

two other sense amplifiers for sensing and amplifying the voltage level difference between each voltage of said two input/output lines and the reference voltage; and a logic gate for generating the final test output signals by comparing output signals of said two other sense amplifiers used to sense the voltage level difference between the reference voltage and the voltage of said input/output lines.

2. The parallel test circuit as claimed in claim 1, wherein during the normal read mode, only the selected data are transferred from the cell blocks and then read out; and during the parallel test mode, all the data to be tested are input into the circuit simultaneously.

3. The parallel test circuit as claimed in claim 1, wherein each of said load transistors comprise first and second transistors, one of said first and second transistors being always in the on state in order to pre-charge the input/output lines, and the other one of said first and second transistors being driven into the on state during the normal read mode and driven into the off state during the test mode by a control signal whereby the size of the transistors utilized in the normal read mode is reduced to obtain a sufficient voltage difference between said reference voltage and said voltage of said input/output lines.

4. The parallel test circuit as claimed in claim 1, further comprising an additional plurality of load transistors which are dispersely located in several parts of the input/output lines.

* * * * *